(12) United States Patent
Fukasawa

(10) Patent No.: US 9,748,208 B2
(45) Date of Patent: Aug. 29, 2017

(54) LIGHT-EMITTING DEVICE

(75) Inventor: Koichi Fukasawa, Fuefuki (JP)

(73) Assignees: CITIZEN ELECTRONICS CO., LTD., Yamanashi-ken (JP); CITIZEN WATCH CO., LTD., Tokyo (JP)

( * ) Notice: Subject to any disclaimer, the term of this patent is extended or adjusted under 35 U.S.C. 154(b) by 1637 days.

(21) Appl. No.: 13/167,247

(22) Filed: Jun. 23, 2011

(65) Prior Publication Data
US 2011/0316009 A1    Dec. 29, 2011

(30) Foreign Application Priority Data

Jun. 24, 2010    (JP) .............................. P-2010-144131

(51) Int. Cl.
H01L 33/08 (2010.01)
H01L 25/075 (2006.01)
H01L 33/60 (2010.01)
H01L 33/62 (2010.01)

(52) U.S. Cl.
CPC .......... H01L 25/0753 (2013.01); H01L 33/60 (2013.01); H01L 33/62 (2013.01); *H01L 2224/48091* (2013.01)

(58) Field of Classification Search
CPC ................................ H01L 33/36; H01L 33/62
USPC ..................................................... 257/88, 99
See application file for complete search history.

(56) References Cited

U.S. PATENT DOCUMENTS

| | | | |
|---|---|---|---|
| 6,512,248 B1 * | 1/2003 | Takeuchi et al. | 257/81 |
| 2008/0099772 A1 * | 5/2008 | Shuy et al. | 257/88 |
| 2008/0170396 A1 * | 7/2008 | Yuan et al. | 362/244 |
| 2008/0224608 A1 * | 9/2008 | Konishi et al. | 313/505 |

FOREIGN PATENT DOCUMENTS

| | | |
|---|---|---|
| JP | 62-196878 | 8/1987 |
| JP | 2006-222412 A | 8/2006 |
| JP | 2006-525679 A | 11/2006 |
| JP | 5139314 B2 | 2/2013 |
| WO | 2004100343 A2 | 11/2004 |
| WO | 2008050487 A1 | 5/2008 |

OTHER PUBLICATIONS

Office Action of Japanese Patent Application No. 2010-144131, dated Sep. 13, 2013, with English translation.

* cited by examiner

*Primary Examiner* — Marc Armand
*Assistant Examiner* — Sarah Salerno
(74) *Attorney, Agent, or Firm* — Browdy and Neimark, PLLC

(57) ABSTRACT

A light-emitting device includes a substrate, and a plurality of light-emitting arrays or light-emitting groups arranged on the substrate. The light-emitting arrays or light-emitting groups include a plurality of LED elements connected in parallel with a pair of adjacent electrodes. The number of the LED elements constituting each of the light-emitting arrays or the light-emitting groups differs in each of the light-emitting arrays or the light-emitting groups. Of the plurality of light-emitting arrays arranged in parallel with each other or the light-emitting groups arranged in a line, the number of the LED elements of the light-emitting arrays or the light-emitting groups positioned inside the substrate is more than the number of the LED elements of the light-emitting arrays or the light-emitting groups positioned outside the substrate.

11 Claims, 11 Drawing Sheets

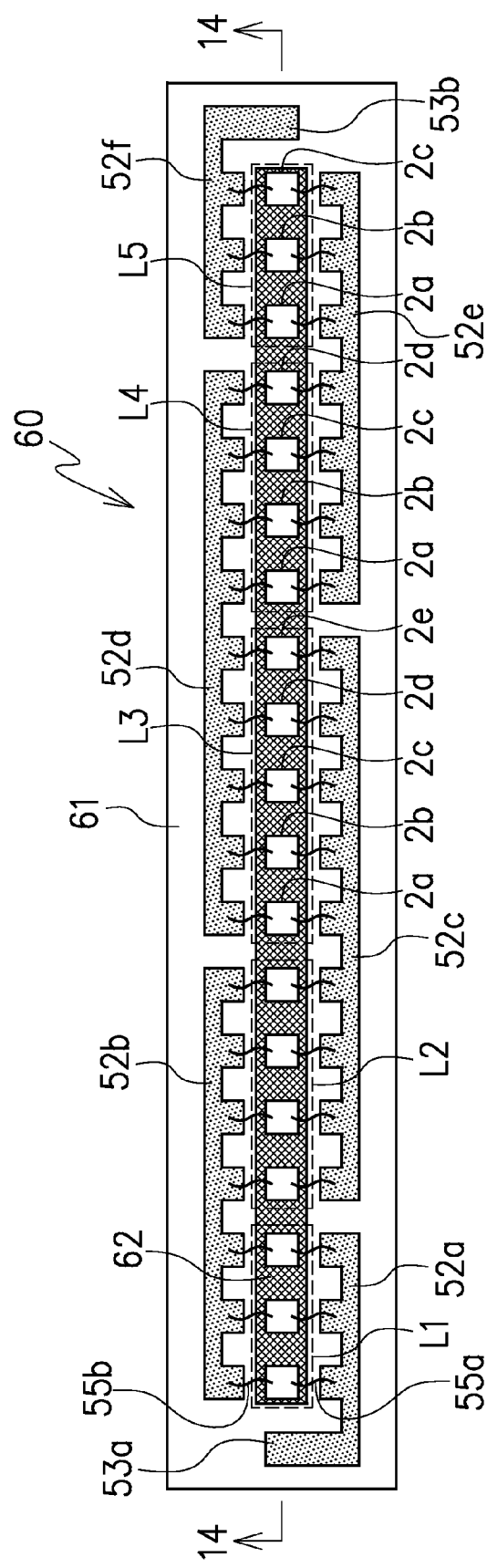
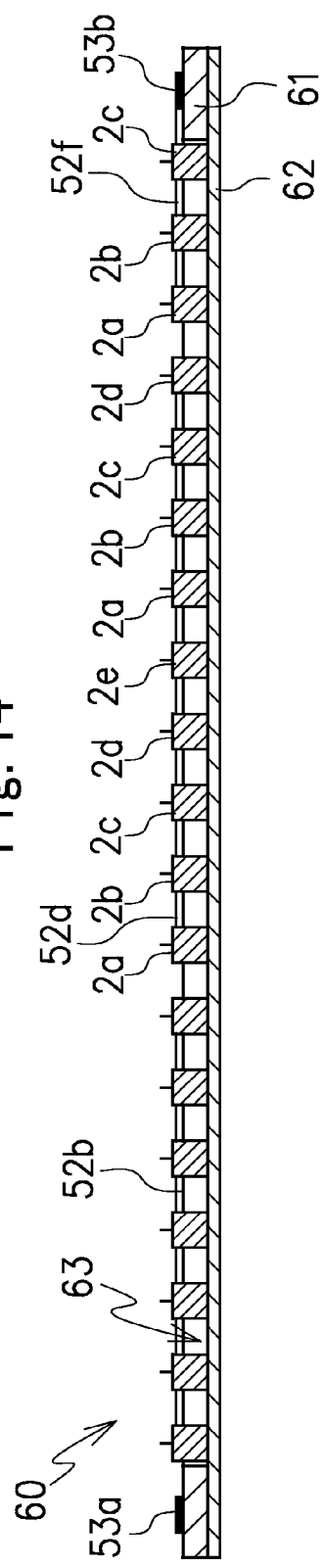

LIGHT-EMITTING DEVICE

CROSS-REFERENCE TO RELATED APPLICATION

This application is based on and claims the priority benefit of Japanese Patent Application No. 2010-144131, filed on Jun. 24, 2010, the disclosure of which is incorporated herein by reference in its entirety.

BACKGROUND OF THE INVENTION

Field of the Invention

The present invention relates to a light-emitting device including a semi-conductor light-emitting element such as a light-emitting diode element (hereinafter referred to as an LED element), more specifically to a light-emitting device having a long service life and capable of reducing deterioration caused by heat-generation.

Description of the Related Art

LED elements are widely used for backlights of color displays, illuminations or the like, because they have a long service life, excellent drive characteristic, high light-emitting efficiency and bright light-emitting color, and are compact.

In particular, if LED elements are used for, for example, flashes of cameras and for general lighting systems instead of conventional lamps such as fluorescent lamps or incandescent lamps, high-brightness is required for such usage. To achieve this, there has been proposed a light-emitting device including a plurality of diode packages each with a structure in which a plurality of LED elements are provided on a substrate and connected in parallel and with a structure of the plurality of diode packages connected each other in series (for reference, Japanese Patent Application Publication No. 2006-222412).

The proposed light-emitting device 100 includes a single elongated substrate 101 which includes a pair of first and second long sides and a pair of first and second short sides, and five diode packages L1, L2, L3, L4, and L5 which are arranged on the substrate 101 and connected in series, as shown in FIG. 15. Each of the diode packages L1 to L5 includes five LED elements 2a, 2b, 2c, 2d, and 2e which are disposed parallel to the pair of first and second short sides and connected in parallel to a pair of supply terminals 103a and 103b. Meanwhile, the diode package L1 is connected through a current-limiting resistor 102 one of the supply terminals 103a, and the diode package L5 is directly connected to another of the supply terminals 103b.

The aforementioned conventional light-emitting device 100 operates as follows.

A light-emitting operation of the light-emitting device is performed by applying a voltage higher than a sum of forward voltages VF of the diode packages L1 to L5, that is to say, a voltage value in which a first forward voltage VF1 of the diode package L1, a second forward voltage VF2 of the diode package L2, a third forward voltage VF3 of the diode package L3, a fourth forward voltage VF4 of the diode package L4, and a fifth forward voltage VF5 of the diode package L5 are added, to the opposite supplying terminals 103a and 103b, and adjusting a current value at that time by the current-limiting resistor 102.

For this reason, it is necessary for the five LED elements 2a to 2e constituting each of the five diode packages L1 to L5 to select and uniform their forward voltages VF and preferable to set a range of variation in the forward voltages to 0.1V or less.

Consequently, even if one or two LED elements that constitute a diode package happen to be electrically disconnected, forward voltage can be supplied to the remaining LED elements in the diode package to light the remaining LED elements. As a result, electrical disconnection of a small number of LED elements has a less impact on operation of the entire illumination device, compared with a situation of total electrical disconnection of LED elements.

Because the number of the LED elements 2a to 2e in each of the diode package L1 to L5 is set to be the same, a circuit structure has a good balance and brightness can be held uniformly by equalizing current values flowing in the LED elements 2a to 2c.

However, if the plurality of diode packages L1 to L5 are arranged on the single substrate 101 as mentioned above, a difference results in a state of heat generation of each diode package. That is to say, when the light-emitting device is operated to emit light, because all of LED elements 2a to 2e arranged in the diode packages L1 to L5 are connected in parallel with the corresponding electrodes 13a and 13b, the generally same current value flows in each LED element and generates heat in approximately the same way.

On the other hand, because the diode packages L1 and L5 positioned at elongated ends of the elongated substrate 101 can release heat outside from the elongated ends, this prevents these two diode packages disposed at elongated ends of the elongated substrate from buildup of the heat, whereas the diode packages L2 and L4 disposed away from the short sides of the elongated substrate or disposed inside of the diode packages L1 and L5 at elongated ends of the elongated substrate tend to keep accumulated buildup temperature, which are blocked by other diode packages L1 and L5. Furthermore, because the diode package L3 is positioned at a central portion of the substrate and sandwiched by the diode packages L1, L2, and the diode packages L3, L4, accumulated heat from the diode packages becomes highest among the diode packages L1 to L5.

FIG. 16 shows a temperature distribution corresponding to positions of the diode packages L1 to L5 on the substrate 101. The horizontal axis shows positions of the diode packages L1 to L5 arranged on the substrate 101, and the vertical axis shows temperatures, which correspond to positions of the diode packages L1 to L5.

As is clear from FIG. 16, the diode packages L1 and L5 arranged on the opposite sides of the substrate 101 are approximately a steady temperature Ts (° C.), whereas the diode package L3 arranged on the central portion of the substrate 101 has a higher temperature Tm (° C.) than the steady temperature. Meanwhile, each of the diode packages L2 and L4 has an intermediate temperature between the steady temperature Ts (° C.) and the higher temperature Tm (° C.). In this way, because the diode package L3 positioned on the central portion of the substrate 101 has a higher temperature than that of the diode packages L1, L2, L4 and L5 positioned at the other positions of the substrate, the LED elements 2a to 2e constituting the diode package L3 deteriorate and simultaneously occur changes in color tone, if the diode package L3 is used for a backlight of a display, there are problems of causing undesirable colors and a light-emitting device of a short life.

SUMMARY OF THE INVENTION

Light-emitting diode device according to some embodiments of the present invention includes a substrate, a plurality of electrode strips arranged parallel to each other on an upper surface of the substrate, and a plurality of light-emitting arrays arranged parallel to each other, the plurality of light-emitting arrays each with a structure in that a plurality of LED elements are arranged in a line between an adjacent pair of the plurality of electrode strips and electrically connected in parallel to the adjacent pair of the plurality of electrode strips by wires.

The plurality of electrode strips and the plurality of light-emitting arrays are arranged alternately and parallel to each other. At least two electrodes for external electrical connection including a first electrode and a second electrode and provided separately from each other, the first electrode provided contiguously at, at least one end of one of two electrode strips of the plurality of electrode strips, the second electrode provided contiguously at, at least one end of an other of the two electrode strips that are positioned at opposite ends of an alternately arranged direction where the plurality of electrode strips and the plurality of light-emitting arrays are arranged alternately and parallel to each other.

The plurality of light emitting arrays are electrically connected in series to the at least two electrodes for external electrical connection.

The plurality of light-emitting arrays that are arranged parallel to each other include a central-position light-emitting array that is positioned in a center of the alternately arranged direction where the plurality of electrode strips and the plurality of light-emitting arrays are arranged alternately and parallel to each other, and the number of the LED elements arranged in the central-position is more than the number of the LED elements arranged in the light-emitting arrays that are positioned adjacent to the two electrode strips that are positioned at opposite ends of the alternately arranged direction where the electrode strips and the light-emitting arrays are arranged alternately and parallel to each other.

The number of the LED elements arranged in each of the light-emitting arrays is gradually decreased from the central-position light-emitting that is positioned in the center of the alternately arranged direction toward the light-emitting arrays positioned adjacent to the two electrode strips that are positioned at opposite ends of the alternately arranged direction.

The substrate may have a square shape, and the light-emitting arrays are arranged in a circle that is concentric with a center of the square substrate.

The at least two electrodes for external electrical connection include the first electrode, the second electrode, a third electrode, and a fourth electrode that are provided separately from each other, the first electrode and the third electrode are provided contiguously at both ends of the one of the two electrode strips, and the second electrode and the fourth electrode are provided contiguously at both ends of the other of the two electrode strips that are positioned at opposite ends of the alternately arranged direction where the electrode strips and the light-emitting arrays are arranged alternately and parallel to each other.

The first electrode, the second electrode, the third electrode, and the fourth electrode are positioned at four corners on the upper surface of the square substrate, and the plurality of light-emitting arrays are arranged in a circle that is concentric with a center of the square substrate.

The light-emitting device may include a metal plate adhered to a lower surface of the substrate, the lower surface opposite to the upper surface of the substrate, the substrate may include a plurality of elongated holes that penetrate the substrate from the upper surface to the lower surface of the substrate and that are arranged parallel to each other, and the plurality of light-emitting diode elements of the light-emitting arrays are directly disposed on an upper surface of the metal plate that is exposed within the elongated holes of the substrate.

Light-emitting device according to another embodiments includes an elongated substrate including a pair of first and second long sides opposite to each other and a pair of first and second short sides opposite to each other, a plurality of first electrode strips provided along the first long side on an upper surface of the elongated substrate, a plurality of second electrode strips provided along the second long side on the upper surface of the elongated substrate, a light-emitting array including a plurality of LED elements that are arranged in a line and arranged in light-emitting groups between the plurality of first and second electrode strips, the light-emitting groups each with a structure in that the LED elements are electrically connected in parallel to one of the first electrode strips and one of the second electrode strips by wires, and two electrodes for external electrical connection separately provided from each other, contiguously provided at one end of the first electrode strip positioned adjacent to the first short side and at one end of the second electrode strip positioned adjacent to the second short side of the elongated substrate.

The light-emitting groups are electrically connected in series to the two electrodes for external electrical connection separately provided from each other, contiguously provided at the one end of the first electrode strip positioned adjacent to the first short side and at the one end of the second electrode strip positioned adjacent to the second short side of the elongated substrate.

The number of the LED elements in the light-emitting group positioned adjacent to a center of the light-emitting array is more than the number of the LED elements arranged in each of the light-emitting groups that are positioned adjacent to the two electrodes for external electrical connection separately provided from each other, contiguously provided at the one end of the first electrode strip positioned adjacent to the first short side and at the one end of the second electrode strip positioned adjacent to the second short side of the elongated substrate.

Even in their embodiments, the plurality of LED elements may be directly mounted on a metal plate.

BRIEF DESCRIPTION OF THE DRAWINGS

FIG. 13 is a plan view showing a mounted structure of a light-emitting device according to a sixth embodiment of the present invention.

FIG. 14 is a sectional view of the light-emitting device taken along line 14-14 in FIG. 13.

DETAILED DESCRIPTION OF THE PREFERRED EMBODIMENTS

Figure 1:
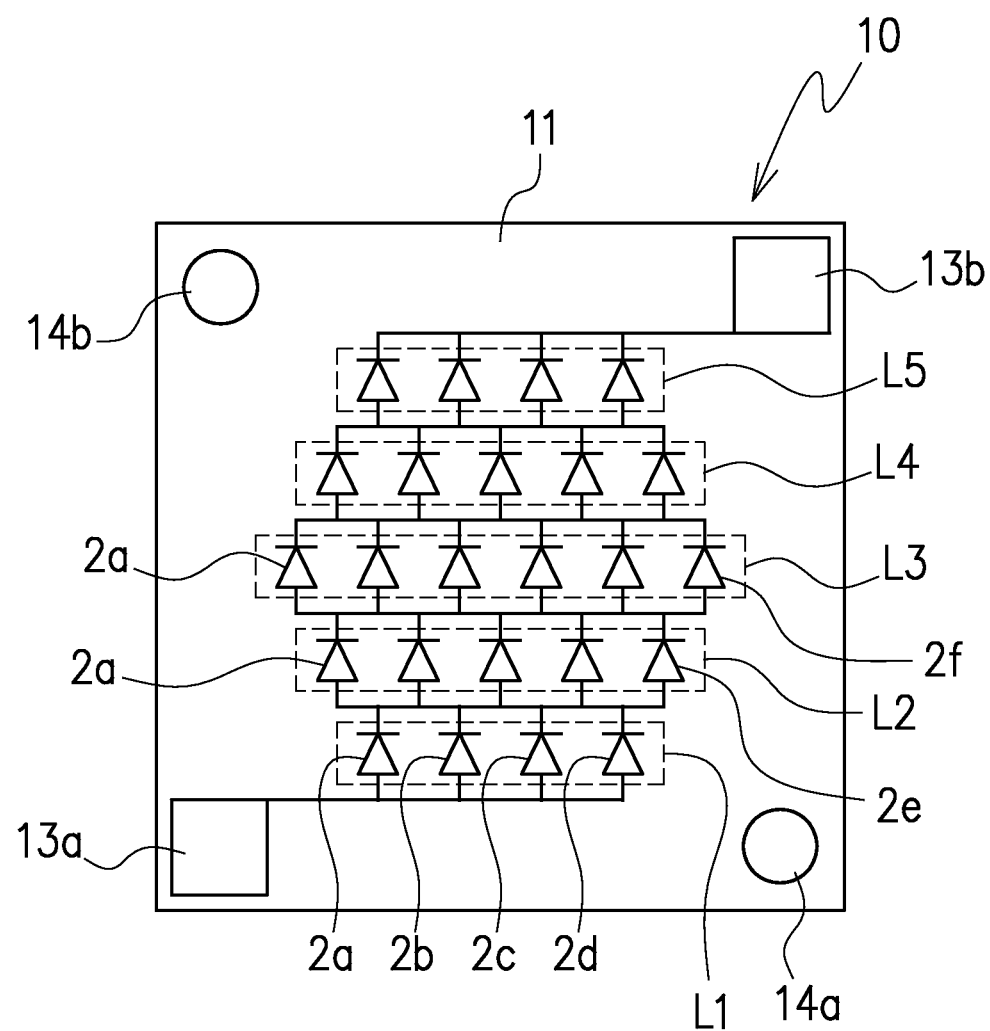
FIG. 1 is a schematic view showing an arrangement and an electrical connection of a plurality of LED elements in a light-emitting device according to a first embodiment of the present invention.

The present invention now will be described more fully hereinafter with reference to the accompanying figures, in which embodiments of the present invention are shown. This invention may, however, be embodied in many alternate forms and should not be construed as limited to the embodiments set forth herein.

Accordingly, while the present invention is susceptible to various modifications and alternative forms, specific embodiments thereof are shown by way of example in the drawings and will herein be described in detail. It should be understood, however, that there is no intent to limit the present invention to the particular forms disclosed, but on the contrary, the present invention is to cover all modifications, equivalents, and alternatives falling within the spirit and scope of the present invention as defined by the claims.

Embodiments of the present invention now will be described generally hereinafter with reference to the accompanying drawings.

Figure 2:
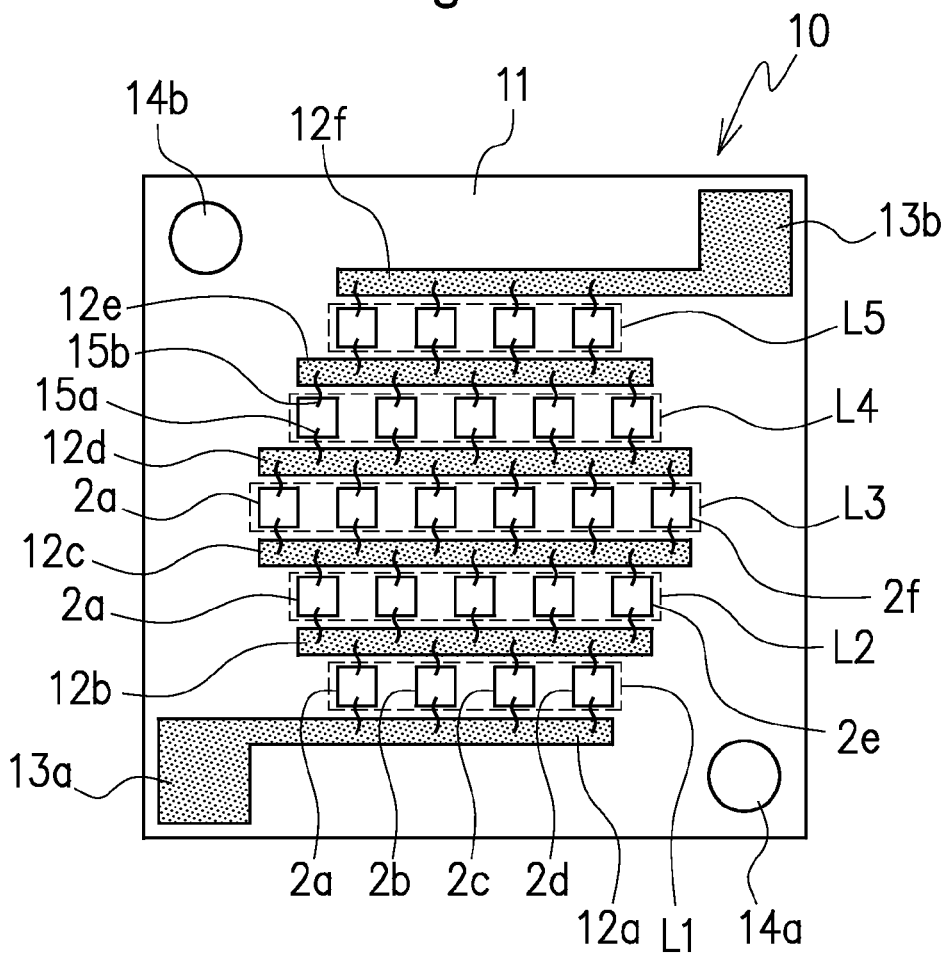
FIG. 2 is a plan view showing a structural example of a plurality of electrode strips and a plurality of light-emitting arrays arranged alternately and parallel to each other, in the light-emitting device as shown in FIG. 1.

FIGS. 1 and 2 illustrate a first embodiment of a light-emitting device according to the present invention.

In the first embodiment, the light-emitting device 10 includes a substrate 11 and a plurality of electrode strips 12a, 12b, 12c, 12d, 12e and 12f arranged parallel to each other on an upper surface of the substrate 11, and a plurality of light-emitting arrays L1, L2, L3, L4 and L5.

The light-emitting arrays L1 to L5 are arranged parallel to each other, each of which including a structure in that a plurality of LED elements 2a, 2b, 2c and 2d are arranged in a line between an adjacent pair of the plurality of electrode strips 12a, 12b, 12c, 12d, 12e and 12f and electrically connected in parallel to the adjacent pair of the plurality of electrode strips 12a, 12b, 12c, 12d, 12e and 12f by wires 15a and 15b. More specifically, the light-emitting array L1 is disposed between the adjacent electrode strips 12a and 12b, the light-emitting array L2 is disposed between the adjacent electrode strips 12b and 12c, the light-emitting array L3 is disposed between the adjacent electrode strips 12c and 12d, the light-emitting array L4 is disposed between the adjacent electrode strips 12d and 12e, and the light-emitting array L5 is disposed between the adjacent electrode strips 12e and 12f.

The plurality of electrode strips 12a, 12b, 12c, 12d, 12e and 12f and the plurality of light-emitting arrays L1, L2, L3, L4 and L5 are arranged alternately and parallel to each other, and at least two electrodes for external electrical connection including a first electrode 13a and a second electrode 13b provided separately from each other, the first electrode 13a is provided contiguously at, at least one end of one (12a) of two electrode strips 12a and 12f of the plurality of electrode strips 12a, 12b, 12c, 12d, 12e and 12f, and the second electrode 13b provided contiguously at, at least one end of an other (12f) of the two electrode strips 12a and 12f.

The two electrode strips 12a and 12f are positioned at opposite ends of an alternately arranged direction where the electrode strips 12a, 12b, 12c, 12d, 12e and 12f and the light-emitting arrays L1, L2, L3, L4 and L5 are arranged alternately and parallel to each other.

In the first embodiment, the substrate 11 has a square shape in which horizontal and vertical sizes are at least similar or the same, and the electrode 13a that is one of anode and cathode electrodes for external electrical connection is contiguously provided at one end of the electrode strip 12a that is positioned at one of two outside ends of the alternately arranged electrode strips and light-emitting arrays, and the electrode 13b that is the other of anode and cathode electrodes for external electrically connection is contiguously provided at one end of the electrode strip 12f that is positioned the other of two outside ends of the alternately arranged electrode strips and light-emitting arrays. In other words, an anode electrode for external connection and a cathode electrode are diagonally positioned at two opposite corners on the upper surface of the square substrate.

The light emitting arrays L1 to L5 are electrically connected in series to the at least two electrodes 13a and 13b for external electrical connection which are provided at respective ends of the two electrode strips 12a and 12f positioned at the two outside and opposite ends of the alternately arranged direction, respectively.

The square substrate 11 includes four corners, and in the drawings, the electrodes 13a and 13b for external electrical connection are diagonally provided at first two opposite corners of the square substrate, and at second two opposite corners of the square substrate, a pair of mounting holes 14a and 14b to attach the light-emitting device 10 to an instrument such as another substrate, frame or the like are provided. However, anode and cathode electrodes for external electrical connection may be provided at four corners of the square substrate, contiguously provided at both ends of each of the two electrode strips 12a and 12f that are positioned at the opposite ends in the arranged direction where the electrode strips and the light-emitting arrays are arranged alternately, in other words, positioned at four corners of the upper surface of the substrate. In this case, the mounting holes 14a and 14b may be provided in a space of the substrate 11.

The plurality of light-emitting arrays that are arranged parallel to each other include a central-position light-emitting array L3 that is positioned in a center of the alternately arranged direction where the plurality of electrode strips and the plurality of light-emitting arrays are arranged alternately and parallel to each other. The central-position light-emitting array L3 is disposed on a center of the square substrate 11. The number of the LED elements 2a to 2d arranged in a line as the central-position light-emitting array L3 is more than the number of the light-emitting elements 2a to 2d arranged in the light-emitting arrays L1 and L5 that are positioned adjacent to the two electrode strips 12a and 12f that are positioned at the two outside and opposite ends of the alternately arranged direction where the electrode strips and the light-emitting arrays are arranged alternately. The arranged direction is shown as a direction of up and down on the drawings.

Each of the light-emitting arrays L1 to L5 includes the plurality of LED elements 2a, 2b, 2c, 2d, 2e and 2f. More specifically, the light-emitting arrays L1 to L5 each having a predetermined number of LED elements 2a to 2f arranged in a line between each pair of the electrode strips 12a to 12f provided on the upper surface of the substrate 11 are arranged. The LED elements 2a to 2f in each of the light-emitting arrays L1 to L5 are connected in parallel to the adjacent pair of electrode strips arranged adjacent to each of the light-emitting arrays by connecting a pair of element electrodes of the LED elements 2a to 2f to the adjacent pair of electrode strips 12a to 12f positioned at the both sides of each light-emitting array by the pair of wires 15a and 15b, respectively. Meanwhile, the light-emitting arrays L1 to L5 are connected in series with the electrodes 13a and 13b for external electrical connection.

In addition, in the first embodiment, the number of the LED elements 2a to 2f in each of the light-emitting arrays L1 to L5 differs from each other. That is to say, in the five light-emitting arrays L1 to L5 on the substrate 11 as shown in the first embodiment, the central-position light-emitting array L3 disposed on the central position of the substrate 11 in the arranged direction where the electrode strips and the light-emitting arrays are arranged alternately has the greatest numbers, six LED elements 2a, 2b, 2c, 2d, 2e, and 2f. The light-emitting arrays L2 and L4 which are arranged in parallel at opposite sides of and outside the light-emitting array L3 have the five LED elements 2a, 2b, 2c, 2d, and 2e. The outermost light-emitting arrays L1 and L5 arranged adjacent to the two electrode strips 12a and 12f positioned at the opposite ends in the arranged direction where the electrode strips and the light-emitting arrays are arranged alternately have four LED elements 2a, 2b, 2c, and 2d.

In this way, in the plurality of light-emitting arrays L1 to L5 which are arranged in parallel with each other, the number of the LED elements arranged in each of the light-emitting arrays is set to reduce progressively from the central light-emitting array L3 positioned at the central portion in the arranged direction toward the light-emitting arrays L1 and L5 disposed at positions close to the opposite ends in the arranged direction.

Next, a light-emitting operation of the light-emitting device 10 structured as mentioned above is explained.

A light-emitting operation of the light-emitting device is performed by applying a voltage higher than a sum of forward voltages VF of the light-emitting arrays L1 to L5, that is to say, a voltage value in which a forward voltage VF1 of the diode package L1, a forward voltage VF2 of the light-emitting array L2, a forward voltage VF3 of the light-emitting array L3, a forward voltage VF4 of the light-emitting array L4, and a forward voltage VF5 of the light-emitting array L5 are added, to the electrodes 13a and 13b for external electrical connection, and adjusting a current value at that time by the current-limiting resistor (not shown).

In the structure as mentioned above, it is necessary to uniform the forward voltages VF of the four to six LED elements 2a to 2f constituting the light-emitting arrays L1 to L5, and preferable to set a range of variations in the forward voltages to be 0.1 v or less. With this structure, even if one of the six LED elements 2a to 2f constituting one diode package is disconnected, the remaining four LED elements keep forward voltages to continue to light, as a result, the disconnection of each LED element has no impact on operation of the entire illumination device.

In addition, in the light-emitting device in the first embodiment, current values flowing in each of the light-emitting arrays L1 to L5 are approximately the same, but because the LED elements 2a to 2f constituting each of the light-emitting arrays L1 to L5 differ in number, the light-emitting arrays L1 to L5 differ in light-emitting amount and amount of heat generation. That is to say, if a current value flowing between the electrodes 13a and 13b for external electrical connection is Is (mA), a current value flowing in the LED elements 2a to 2d of each of the outmost light-emitting arrays L1 and L5 is ¼×Is (mA), a current value flowing in the LED elements 2a to 2e of each of the light-emitting arrays L2 and L4 inside the light-emitting arrays L1 and L5 is ⅕×Is (mA), and a current value flowing in the LED elements 2a to 2f of the central light-emitting arrays L3 is ⅙×Is (mA).

In this way, the light-emitting arrays L1 and L5 which are positioned at the opposite ends in the arranged direction where the electrode strips and the light-emitting arrays are arranged alternately and at positions close to the electrode strips 12a and 12f connected to the electrodes 13a and 13b for external electrical connection and in which the current value of ¼×Is (mA) flows in the LED elements 2a to 2d have a largest amount of heat generation. The light-emitting arrays L2 and L4 which are positioned at positions separating from the electrodes 13a and 13b for external electrical connection toward the center in the arranged direction and in which the current value of ⅕×Is (mA) flows in the LED elements 2a to 2e have an amount of heat generation lesser than that of the light-emitting arrays L1 and L5. The light-emitting array L3 which is positioned at a position most separating from the electrodes 13a and 13b for external electrical connection and at the central position in the arranged direction and in which only the current value of ⅙×Is (mA) flows in the LED elements 2a to 2f has a least amount of heat generation.

Figure 3:
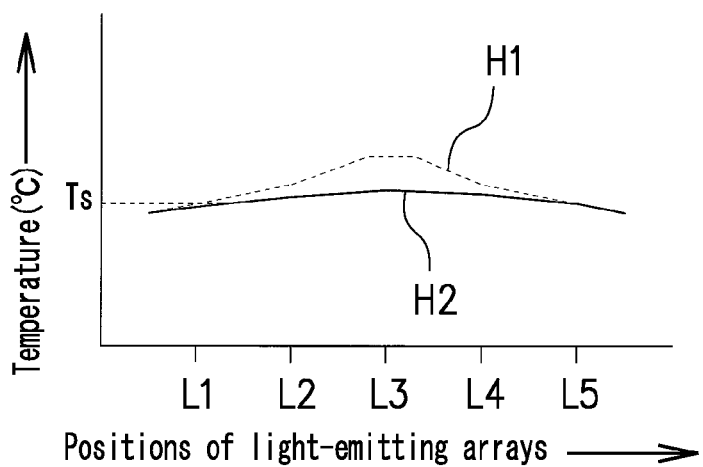
FIG. 3 is a view showing a temperature distribution of the light-emitting device in the structural example as shown in FIG. 2.

FIG. 3 illustrates a temperature distribution on the substrate 11 of the light-emitting device 10 structured as mentioned above.

As is clear from FIG. 3, a temperature in which each of the light-emitting arrays L1 to L5 holds is close to a steady temperature Ts (° C.) as shown by a flattened temperature curve H2. In FIG. 3, a temperature curve H1 shown by a dashed line illustrates a temperature distribution of the conventional light-emitting device 100 for comparison with the first embodiment. As is clear from the temperature distributions between the two, because, in the first embodiment, a temperature of the central-position light-emitting array L3 that is positioned at the central portion of the substrate 11 can be prevented from being increased, it is possible to acquire a light-emitting device having a long service life and stable color tone without generating deterioration and change in color due to a high temperature.

Meanwhile, because a small current value flows in each of the LED elements 2a to 2f constituting the light-emitting array L3 positioned at the central portion, a light-emitting amount per one LED element becomes less, but a total light-emitting amount of the light-emitting array L3 is approximately the same as that of the other light-emitting arrays because the light-emitting array L3 has the largest number of LED elements.

Figure 4:
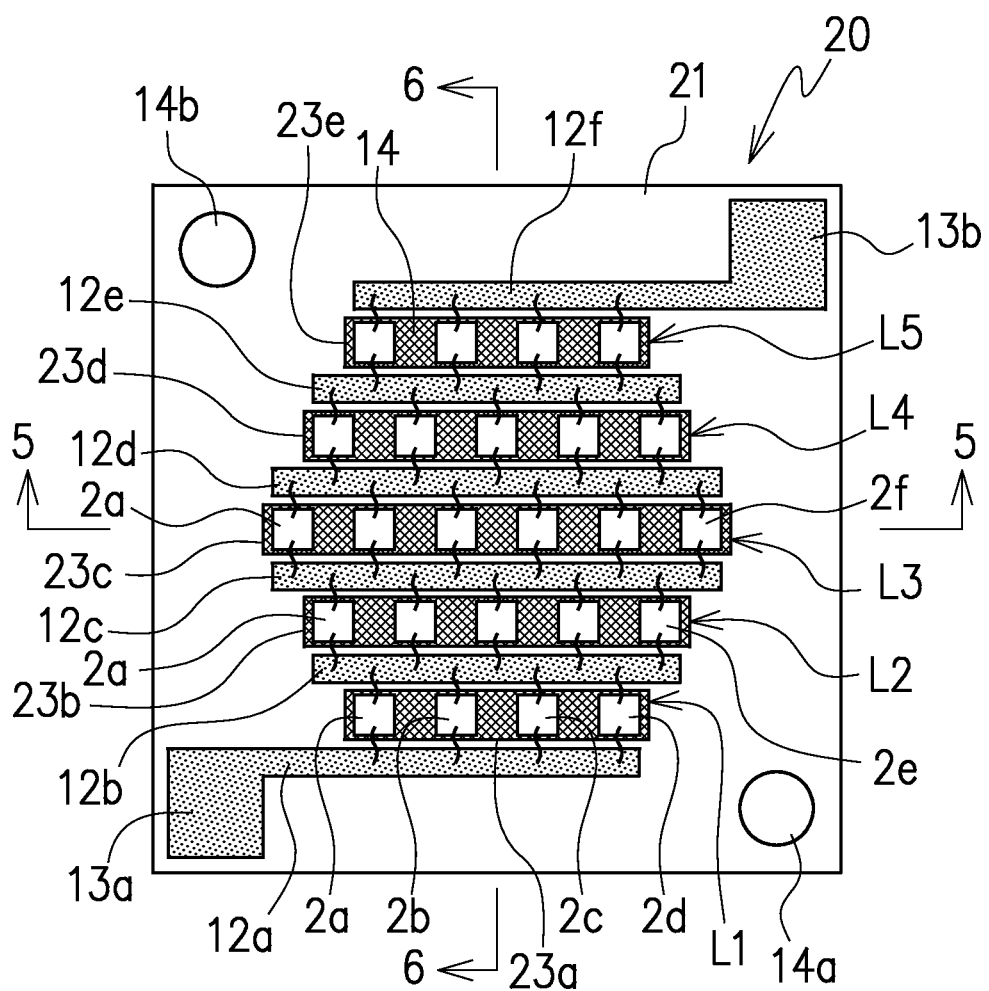
FIG. 4 is a plan view showing a mounted structure of a light-emitting device according to a second embodiment of the present invention.
Figure 5:
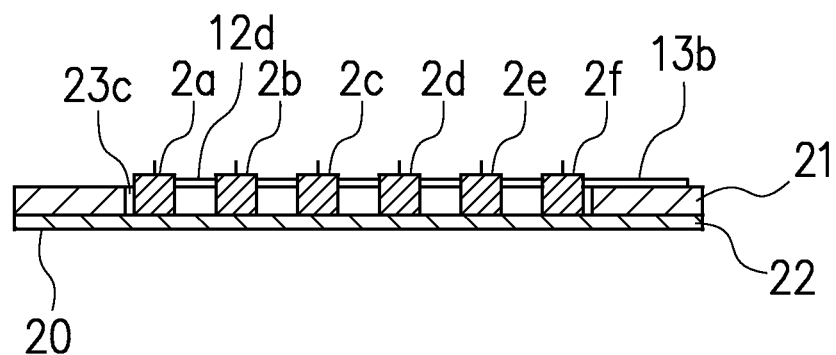
FIG. 5 is a sectional view of the light-emitting device taken along line 5-5 in FIG. 4.
Figure 6:
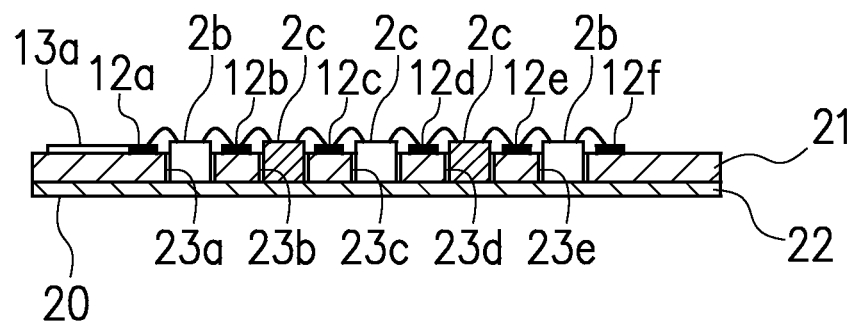
FIG. 6 is a sectional view of the light-emitting device taken along line 6-6 in FIG. 4.

FIGS. 4 to 6 illustrate a second embodiment of a light-emitting device according to the present invention. The light-emitting device 20 according to the second embodiment has a basic structure similar to that of the light-emitting device 10 in the first embodiment, as shown in FIG. 4. Accordingly, identical reference numbers are attached to similar parts to that of the light-emitting device 10, the duplicative description thereof is omitted.

The light-emitting device 20 according to the second embodiment differs from the first embodiment in that a metal plate 22 as a heat-release member is adhered to a lower surface of a substrate 21, the lower surface opposite to the upper surface of the substrate 21. Also, the substrate 21 has a plurality of elongated holes 23a, 23b, 23c, 23d, and 23e that penetrate the substrate 21 from the upper surface to the lower surface of the substrate 21 and provided parallel to each other at positions where the plurality of light-emitting arrays L1 to L5 are arranged parallel to each other. A plurality of LED elements 2a to 2f in each of the light-emitting arrays L1 to L5 are directly disposed on an upper surface of the metal plate that is exposed within the elongated holes 23a, 23b, 23c, 23d, and 23e of the substrate 21, as shown in FIGS. 5 and 6. The elongated holes include a central-position elongated hole 23c that is longest of all the elongated holes 23a, 23b, 23c, 23d, and 23e.

A shape of each of the elongated holes 23a to 23e provided in the substrate 21 corresponds to a length of each of the light-emitting arrays L1 to L5. Because the central-position light-emitting array L3 positioned at a central portion of the square substrate has most LED elements, here six LED elements 2a to 2f, the central-position elongated hole 23c includes a length corresponding to the length of the central-position light-emitting array L3. Because each of a pair of light-emitting arrays L2 and L4 arranged at opposite sides of the elongated hole 23c has five LED elements 2a to 2e, each of the elongated holes 23b and 23d has a length shorter than that of the elongated hole 23c. Because each of the outermost light-emitting arrays L1 and L5 arranged adjacent to two electrode strips 12a and 12f positioned at opposite ends in an arranged direction where electrode strips 12a to 12f and the light-emitting arrays L1 to L5 are arranged alternately has four LED elements 2a to 2d, each of a pair of corresponding outermost elongated holes 23a and 23e has a length further shorter than the elongated holes 23b and 23d. Meanwhile, the metal plate 22 is preferably made of a material having a high heat conductivity, preferably aluminum having a light weight and high heat conductivity. However, the material is not limited to aluminum or the like and the metal plate may be made of any material.

With the light-emitting device 20 according to the second embodiment, the heat-release operation of the metal plate 22 adhered to the lower surface of the substrate 21 makes it possible to release heat occurred in the plurality of LED elements 2a to 2f constituting each of the light-emitting arrays L1 to L5. Moreover, in the second embodiment, the same temperature distribution as in the first embodiment in the substrate 21 of the light-emitting device 20 can be acquired, the entire temperature distribution of the substrate 21 becomes a flattened temperature curve, and the steady temperature Ts (° C.) can be reduced further by the heat-release operation of the metal plate 22.

Figure 7:
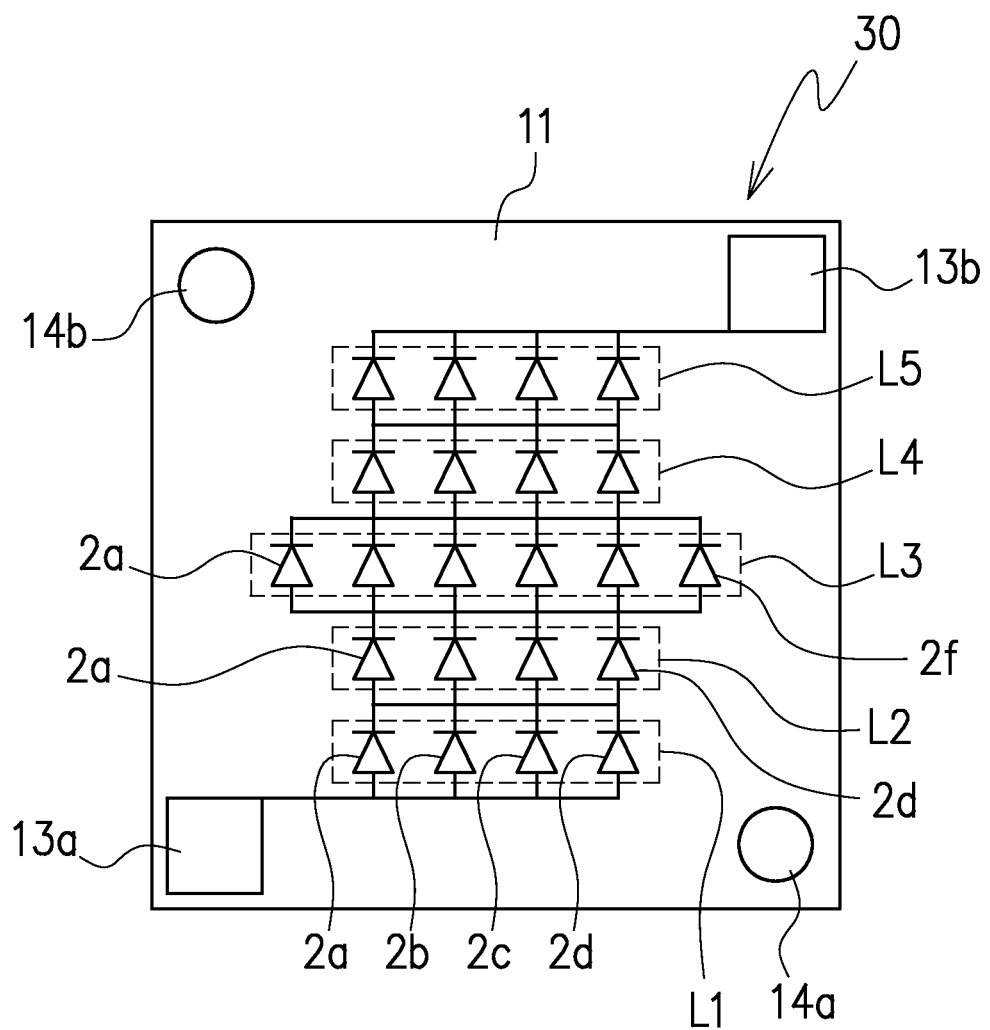
FIG. 7 is a schematic view showing an arrangement and an electrical connection of a plurality of LED elements in a light-emitting device according to a third embodiment of the present invention.
Figure 8:
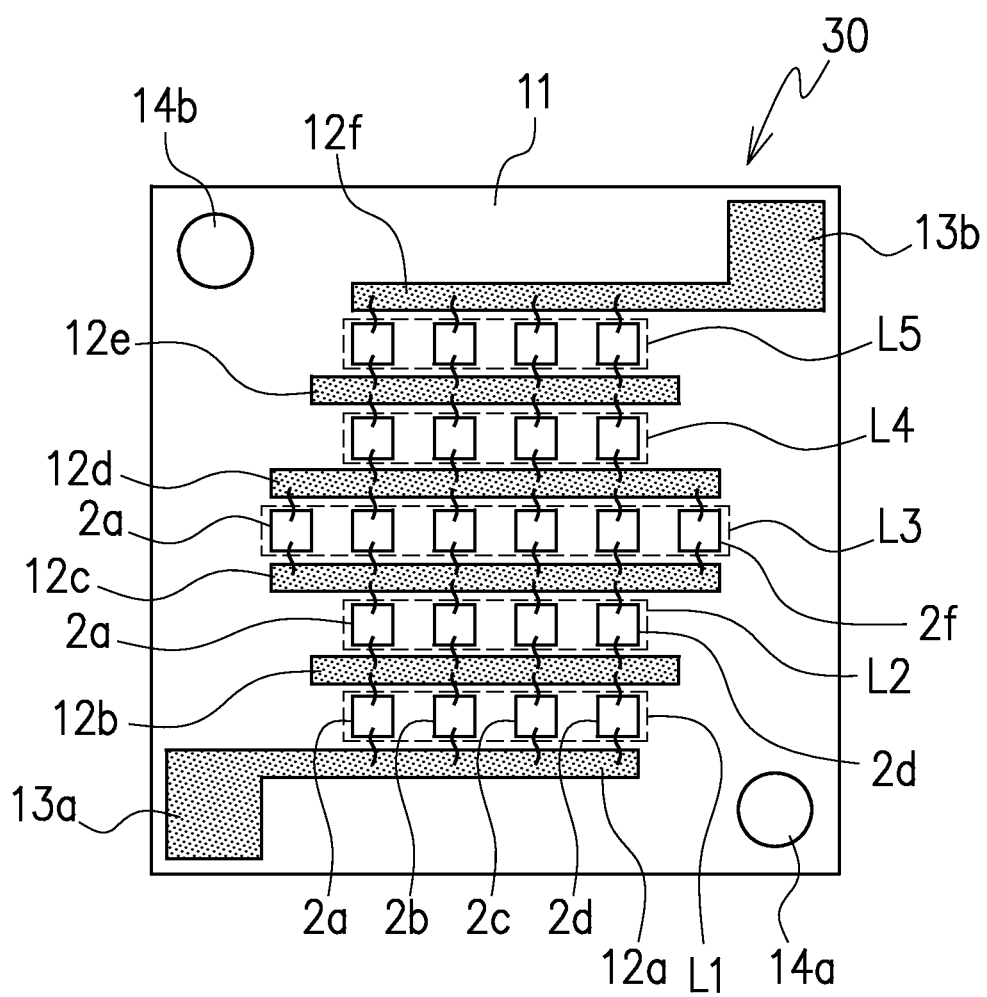
FIG. 8 is a plan view showing a structural example of a plurality of electrode strips and a plurality of light-emitting arrays arranged alternately and parallel to each other, in the light-emitting device as shown in FIG. 7.

FIGS. 7 and 8 illustrate a third embodiment of the light-emitting device according to the present invention. The light-emitting device 30 in the third embodiment has a basic structure approximately similar to that of the light-emitting device 10 in the first embodiment. Accordingly, in the third embodiment, identical reference number are attached to parts similar to the light-emitting device 10, the duplicative description thereof is omitted.

The light-emitting device 30 in the third embodiment differs from the previous embodiments in that each of the pair of light-emitting arrays L2 and L4 positioned immediately outside the light-emitting array L3 arranged at the central portion of the substrate 11, of the five light-emitting arrays L1 to L5 arranged on the substrate 11 includes four LED elements 2a to 2d.

In other words, in the previous embodiments, each the light-emitting arrays L2 and L4 arranged at the same positions includes five LED elements 2a to 2e, whereas, in the light-emitting device 30, each of the light-emitting arrays L2 and L4 includes four LED elements 2a to 2d, this number is the same as the number of each of the LED elements constituting the light-emitting arrays L1 and L5 arranged outwardly.

The light-emitting device 30 according to this embodiment has a temperature distribution larger slightly than that of the light-emitting device 10 according to the previous embodiment. However, in the light-emitting device 30, the five light-emitting arrays L1 to L5 can be arranged on the substrate 11 compactly, thereby a high mounting efficiency can be obtained.

Figure 9:
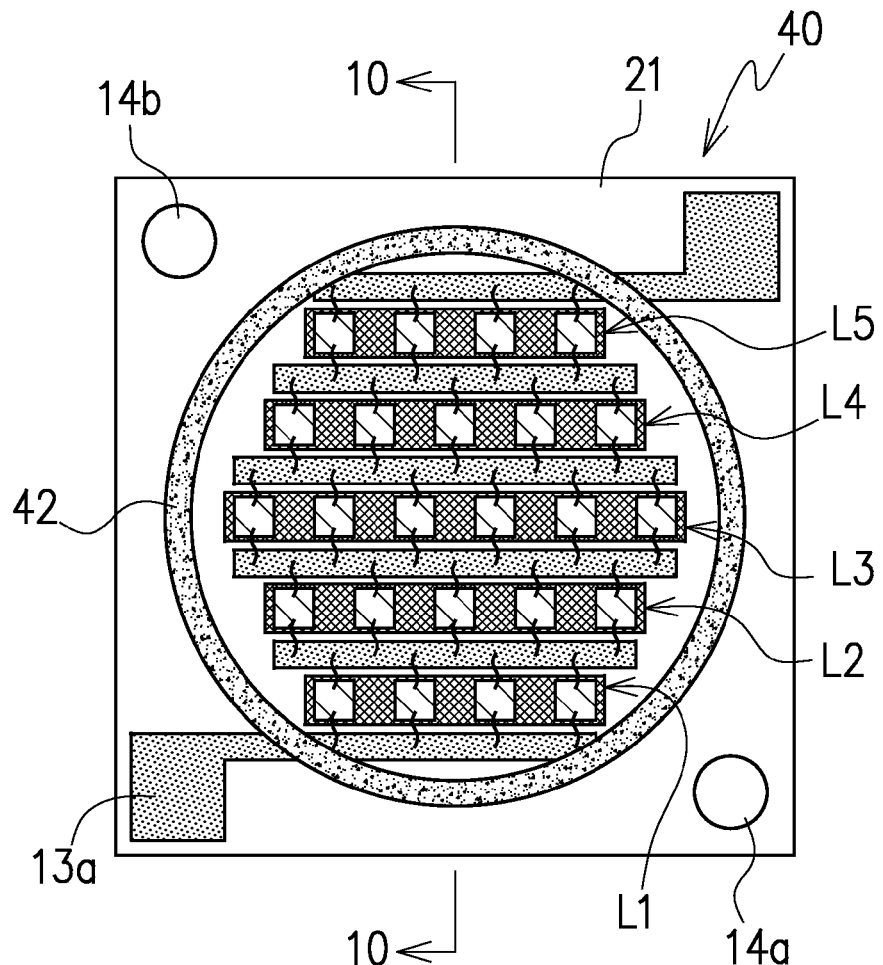
FIG. 9 is a plan view showing a mounted structure of a light-emitting device according to a fourth embodiment of the present invention.
Figure 10:
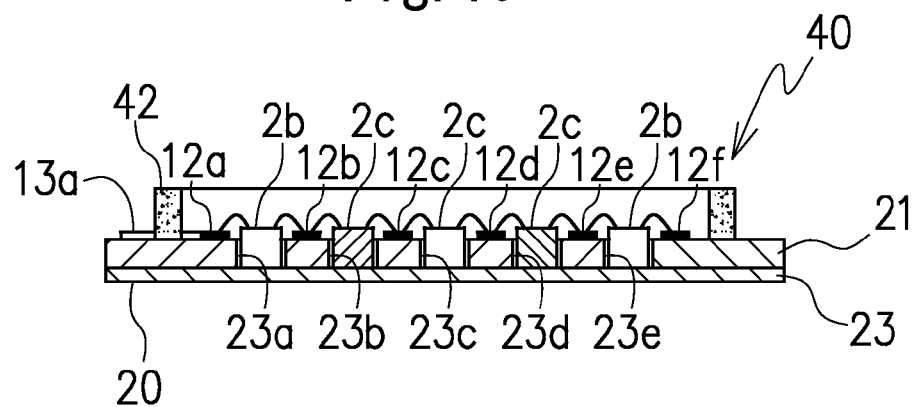
FIG. 10 is a sectional view of the light-emitting device taken along line 10-10 in FIG. 9.

FIGS. 9 and 10 illustrate a fourth embodiment of the light-emitting device according to the present invention.

In the light-emitting device 40 in this embodiment, a square substrate 21 in which horizontal and vertical sizes are equal is used, similarly to the first embodiment, and a plurality of light-emitting arrays L1 to L5 arranged in parallel with each other are disposed in approximately a circular area on the same axis as a center of the square substrate.

Meanwhile, the light-emitting device 40 in the fourth embodiment has a basic structure approximately similar to that of the light-emitting device 20 in the first embodiment. Accordingly, in the third embodiment, identical reference number are attached to parts similar to the light-emitting device 20 in the second embodiment, the duplicative description thereof is omitted.

As shown in FIGS. 9 and 10, in the light emitting device 40 in the fourth embodiment, a circular reflection frame 42 is provided to surround the five light-emitting arrays L1 to L5 arranged on the substrate 21. That is to say, the light-emitting device 40 has a structure in which the reflection frame 42 is disposed on an upper surface of the substrate 21 of the light-emitting device 20 according to the previous second embodiment. A lower surface of the reflection frame 42 is adhered to the upper surface of the substrate 21. A material for the reflection frame 42 is not limited in particular, but if a resin material is used for the reflection frame, it is preferable to apply a treatment to improve a reflection rate on an inner peripheral surface of the reflection frame 42. In addition, a height and a diameter of the reflection frame 42 are not limited to what is shown in the embodiments.

In the light-emitting device 40 according to this embodiment, by the reflection frame 42 provided to surround the light-emitting arrays L1 to L5, it is possible to enhance light-collection property of light emitted from the light-emitting arrays L1 to L5, flatten further a temperature distribution of the entirety of the substrate 21, and prevent effectively changes in color tone from being generated.

Figure 11:
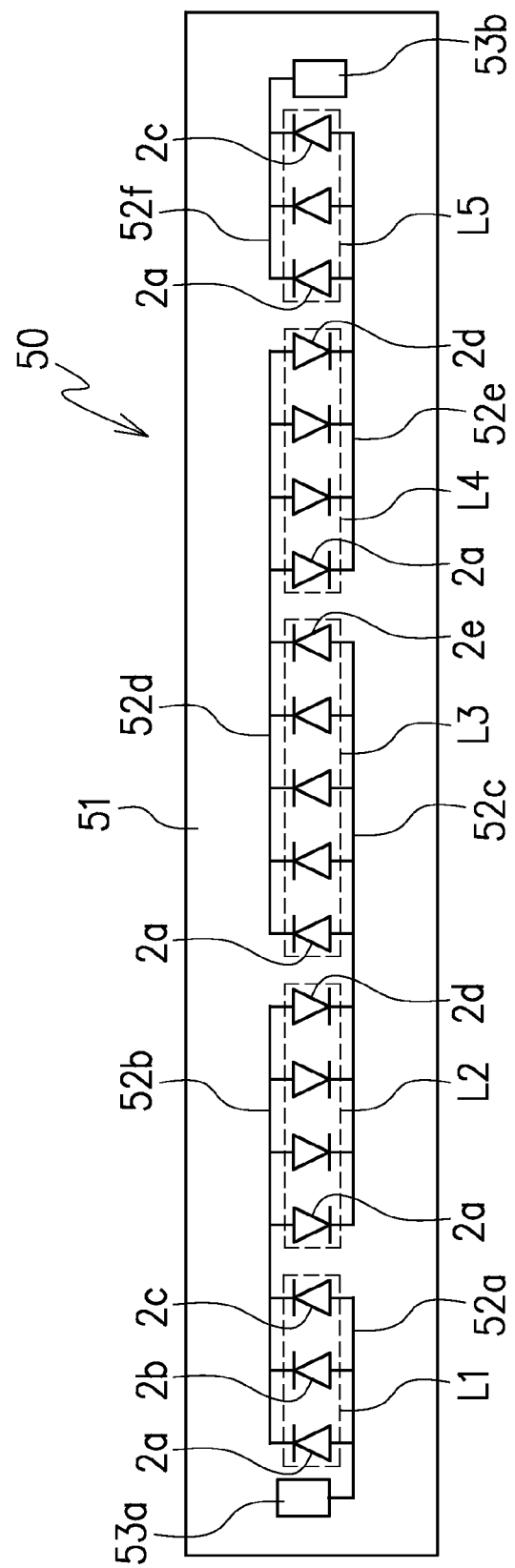
FIG. 11 is a schematic view showing an electrical connection of a plurality of LED elements arranged in one light-emitting array composed of a plurality of light-emitting groups, in a light-emitting device according to a fifth embodiment of the present invention.
Figure 12:
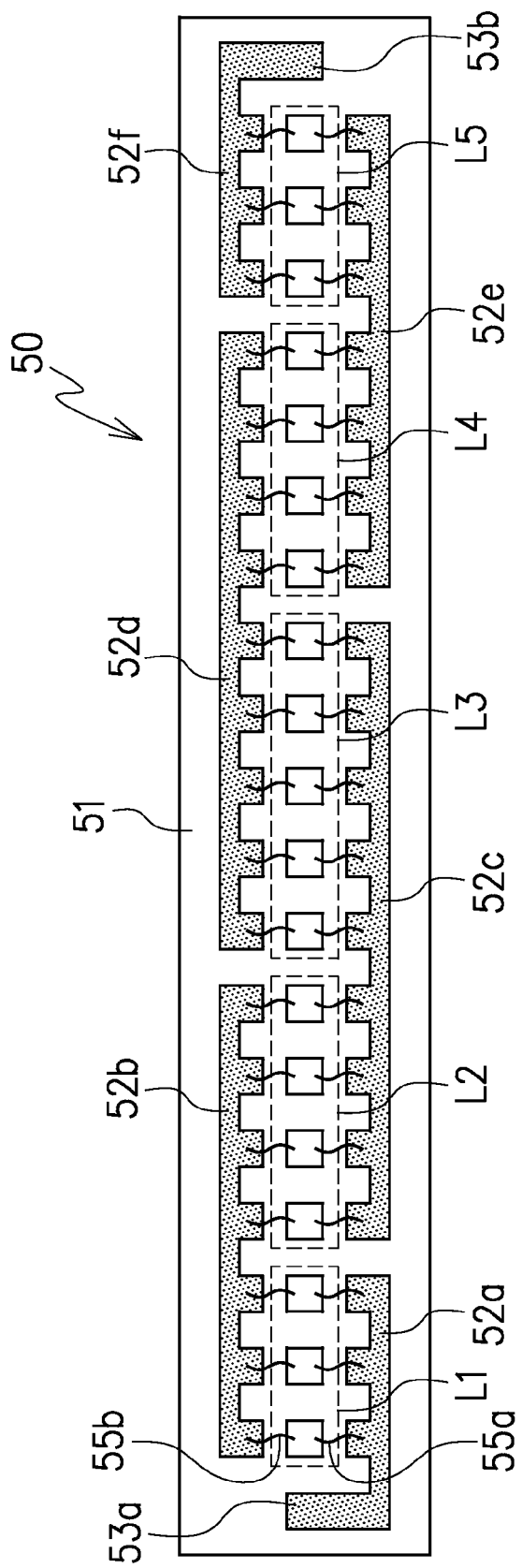
FIG. 12 is a plan view showing a mounted structure of the light-emitting device as shown in FIG. 11.
Figure 15:
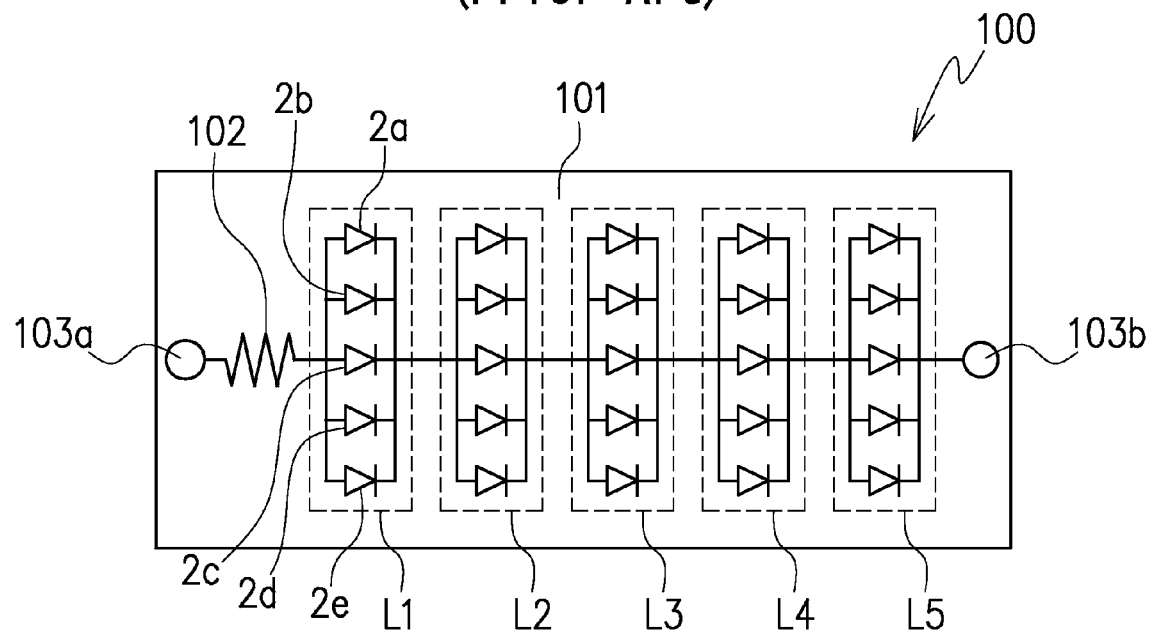
FIG. 15 is a schematic view showing an electrical connection of a plurality of LED elements, in a conventional light-emitting device.
Figure 16:
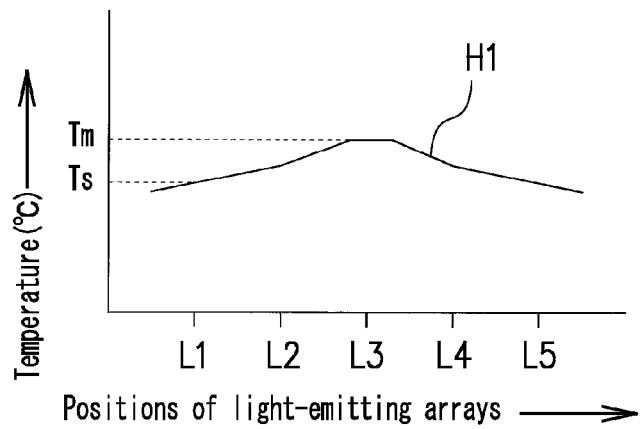
FIG. 16 is a view showing a temperature distribution of the light-emitting device as shown in FIG. 15.

FIGS. 11 and 12 illustrate a fifth embodiment of the light-emitting device according to the present invention.

The light-emitting device 50 in this embodiment includes an elongated substrate 51 having a pair of long sides and a pair of short sides, a plurality of first electrode strips 52b, 52d and 52f arranged on an upper surface of the elongated substrate 51 along a first long side which is one of the pair of long sides, a plurality of second electrode strips 52a, 52c and 52e arranged on an upper surface of the elongated substrate 51 along a second long side which is the other of the pair of long sides, and one light-emitting array composed of a plurality of light-emitting groups L1 to L5 which are arranged at a central portion of the substrate 51 and arranged in a line between the first electrode strips 52b, 52d and 52f and the second electrode strips 52a, 52c and 52e. Each of the light-emitting groups L1 to L5 has a plurality of LED elements 2a to 2c, 2a to 2d, or 2a to 2e. The LED elements are connected in parallel to the first electrode strips 52b, 52d and 52f and the second electrode strips 52a, 52 c and 52e through a pair of wires 55a and 55b. The first electrode strip 52f disposed along the first long side and at a position close to a first short side is connected to an electrode 53b for external electrical connection. The second electrode strip 52a disposed along the second long side and at a position close to a second short side is connected to an electrode 53a for external electrical connection.

Meanwhile, the plurality of light-emitting groups L1 to L5 have a basic structure approximately similar to the plurality of light-emitting arrays L1 to L5 in the previous first embodiment. Accordingly, in the fifth embodiment, identical reference number are attached to parts similar to the light-emitting device 10 in the first embodiment, the duplicative description thereof is omitted.

In this embodiment, the number of the LED elements constituting the light-emitting group L3 arranged at a central portion in a longitudinal direction of the substrate 51 is more than the number of the LED elements constituting the light-emitting groups L1, L2, L4 and L5 in which the light-emitting groups L1 and L2 are arranged in one side of the light-emitting group L3, and the light-emitting groups L4 and L5 are arranged in another side of the light-emitting group L3.

That is to say, of the five light-emitting groups L1 to L5 arranged on the substrate in a line, the light-emitting group L3 at the central position of the substrate 51 has the greatest numbers, five LED elements 2a, 2b, 2c, 2d, and 2e. The light-emitting groups L2 and L4 which are arranged outside and adjacent to the light-emitting group L3 have the four LED elements 2a, 2b, 2c, and 2d which are lesser than the light-emitting group L3 in number. The outermost two light-emitting groups L1 and L5 arranged at outermost positions of the substrate 51 have the least, three LED elements 2a, 2b, and 2c. In other words, in the light-emitting array comprising the plurality of light-emitting groups L1 to L5 arranged in a line, the number of the LED elements 2a to 2e connected in parallel with the first and second electrode strips 52d and 52c arranged close to the central portion of the light-emitting array is more than the number of LED elements 2a to 2c connected in parallel with the first and second electrode strips 52f and 52a arranged close to the first and second short sides of the substrate 51.

In this way, the light-emitting device 50 has a structure in which the number of the plurality of LED elements constituting the light-emitting groups reduces one by one as going away outward from the light-emitting group L3 disposed at the central portion of the rectangular substrate 51. In addition, in this embodiment, the electrode strips 52a to 52f are printed on an upper surface of the substrate 51 along opposite sides of the five light-emitting groups L1 to L5 arranged on the substrate 51. Element electrodes of all the LED elements 2a to 2e constituting the light-emitting groups L1 to L5 are connected through the wires 55a and 55b to the electrode strips 52a to 52f. Consequently, the LED elements of the light-emitting groups L1 to L5 are connected in parallel, and the five light-emitting groups L1 to L5 are connected in series with the electrode 53b for external electrical connection connected to one end of the first electrode strips, which is disposed close to the first short side of the substrate and the electrode 53a for external electrical connection connected to one end of the second electrode strips, which is disposed close to the second short side of the substrate.

FIGS. 13 and 14 illustrate a sixth embodiment of the light-emitting device according to the present invention.

The light-emitting device 60 in the sixth embodiment has a basic structure approximately similar to that of the light-emitting device 50 in the fifth embodiment. Accordingly, in the third embodiment, identical reference number are attached to parts similar to the light-emitting device 50 in the fifth embodiment, the duplicative description thereof is omitted.

The light-emitting device in this embodiment differs from the previous embodiments in that a metal plate 62 as a heat-release member is provided on a lower surface of the substrate 61, and a elongated hole 63 having an elongated shape disposed in a central portion of the substrate 61 along a pair of long sides of the substrate 61 is provided, as shown in FIGS. 13 and 14. All of LED elements 2a to 2e constituting five light-emitting groups L1 to L5 are arranged in a line in the elongated hole 63 of the substrate 61, and a lower surface of each of the LED elements 2a to 2e is attached to an upper surface of the metal plate 62, exposing in the elongated hole 63. In addition, a pair of element electrodes of each of the LED elements 2a to 2e are connected through a pair of wires 55a and 55b to electrode strips 52 to 52f arranged to extend along the long sides of the substrate on opposite sides of the elongated hole 63.

Consequently, because the light-emitting device 60 in this embodiment includes the metal plate 62 as the heat-release member adhered to the lower surface of the substrate 61, it is possible to obtain larger heat-release effect for the LED elements 2a to 2e than that of the light-emitting device 50 in the previous fifth embodiment, thereby temperature up of the entire light-emitting device can be limited further.

Because each of the light-emitting devices 50 and 60 in the fifth and sixth embodiments has a long shape, they are suitable for a side light which is used to be disposed on a side of a plane display such as a television, personal computer or the like to accomplish an improvement of color tone required for the plane-type display even if there are changes in temperature.

As mentioned above, according to the light-emitting devices in the embodiments, it is possible to provide a light-emitting device capable of reducing an amount of heat generation of the LED elements at the central portion of the substrate, consequently flattening a temperature of heat generation of the entire light-emitting device, preventing the LED elements from being deteriorated, having a long service life, and preventing color tone from being changed.

Although the preferred embodiments of the present invention have been described, it should be understood that the present invention is not limited to these embodiments, various modifications and changes can be made to these embodiments. For example, in the aforementioned embodiments, although the five light-emitting arrays or five light-emitting groups are provided and the largest six LED elements constituting each of the light-emitting arrays or the light-emitting groups are provided, the number of the light-emitting arrays or light-emitting groups and the arranged LED elements is not limited to the number shown in the embodiments. Even if the number is several dozen or several hundred, the number should be included in a scope of the present invention.

What is claimed is:

1. A light-emitting device comprising:
a substrate;
a plurality of electrode strips arranged parallel to each other on an upper surface of the substrate;
a plurality of light-emitting arrays arranged parallel to each other, the plurality of light-emitting arrays each with a structure in that a plurality of light-emitting diode elements are arranged in a line between an adjacent pair of the plurality of electrode strips and electrically connected in parallel to the adjacent pair of the plurality of electrode strips by wires;
the plurality of electrode strips and the plurality of light-emitting arrays being arranged alternately and parallel to each other; and
at least two electrodes for external electrical connection including a first electrode and a second electrode and provided separately from each other, the first electrode provided contiguously at, at least one end of one of two electrode strips of the plurality of electrode strips, the second electrode provided contiguously at, at least one end of an other of the two electrode strips that are positioned at opposite ends of an alternately arranged direction where the plurality of electrode strips and the plurality of light-emitting arrays are arranged alternately and parallel to each other,
wherein the plurality of light-emitting arrays, that are arranged parallel to each other include a central-position light-emitting array that is positioned in a center of the alternately arranged direction where the plurality of electrode strips and the plurality of light-emitting arrays are arranged alternately and parallel to each other, and
wherein the number of the light-emitting diode elements arranged in each of the light-emitting arrays is gradually decreased from the central-position light-emitting array that is positioned in the center of the alternately arranged direction toward the light-emitting arrays positioned adjacent to the two electrode strips where the electrode strips and the light-emitting arrays are arranged alternately and parallel to each other.

2. The light-emitting device according to claim 1:
wherein the plurality of light emitting arrays are electrically connected in series to the at least two electrodes for external electrical connection.

3. The light-emitting device according to claim 1:
wherein the plurality of light-emitting arrays that are arranged parallel to each other include a central-position light-emitting array that is positioned in a center of the alternately arranged direction where the plurality of electrode strips and the plurality of light-emitting arrays are arranged alternately and parallel to each other, and
wherein the number of the light-emitting diode elements arranged in the central-position light-emitting array is more than the number of the light-emitting elements arranged in the light-emitting arrays that are positioned adjacent to the two electrode strips that are positioned at opposite ends of the alternately arranged direction.

4. The light-emitting device according to claim 2:
wherein the substrate has a square shape and the plurality of light-emitting arrays are arranged in a circle that is concentric with a center of the square substrate.

5. The light-emitting device according to claim 1:
wherein the at least two electrodes for external electrical connection include the first electrode, the second electrode, a third electrode, and a fourth electrode that are provided separately from each other, the first electrode and the third electrode are provided contiguously at both ends of the one of the two electrode strips, and the second electrode and the fourth electrode are provided contiguously at both ends of the other of the two electrode strips that are positioned at opposite ends of the alternately arranged direction where the electrode strips and the light-emitting arrays are arranged alternately and parallel to each other.

6. The light-emitting device according to claim 5:
wherein the substrate has a square shape, the first electrode, the second electrode, the third electrode, and the fourth electrode are positioned at four corners on the upper surface of the square substrate, and the plurality of light-emitting arrays are arranged in a circle that is concentric with a center of the square substrate.

7. The light-emitting device according to claim 1:
further comprising a metal plate adhered to a lower surface of the substrate, the lower surface opposite to the upper surface of the substrate;
the substrate further including a plurality of elongated holes that penetrate the substrate from the upper surface to the lower surface of the substrate and that are arranged parallel to each other; and
wherein the plurality of light-emitting diode elements of the light-emitting arrays are directly disposed on an upper surface of the metal plate that is exposed within the elongated holes of the substrate.

8. The light-emitting device according to claim 3:
further comprising a metal plate adhered to a lower surface of the substrate, the lower surface opposite to the upper surface of the substrate;
wherein, of the plurality of elongated holes penetrating the substrate from the upper surface to the lower surface of the substrate, the plurality of elongated holes include a central-position elongated hole in that the central position light-emitting array is disposed on an upper surface of the metal plate; and
wherein the central-position elongated hole is longer than the elongated holes positioned adjacent to the two electrode strips that are positioned at the opposite ends of the alternately arranged direction where the electrode strips and the light-emitting arrays that are arranged alternately and parallel to each other.

9. A light-emitting device comprising:
an elongated substrate including a pair of first and second long sides opposite to each other and a pair of first and second short sides opposite to each other;
a plurality of first electrode strips provided along the first long side on an upper surface of the elongated substrate;
a plurality of second electrode strips provided along the second long side on the upper surface of the elongated substrate;
a light-emitting array including a plurality of light-emitting diode elements that are arranged in a line and arranged in light-emitting groups between the plurality of first and second electrode strips, the light-emitting groups each with a structure in that the light-emitting diode elements are electrically connected in parallel to one of the first electrode strips and one of the second electrode strips by wires; and two electrodes for external electrical connection separately provided from each other, contiguously provided at one end of the first electrode strip positioned adjacent to the first short side and at one end of the second electrode strip positioned adjacent to the second short side of the elongated substrate, wherein the number of the light-emitting diode elements in the light-emitting group positioned adjacent to a center of the light-emitting array is more than the number of the light-emitting diode elements arranged in each of the light-emitting groups that are positioned adjacent to the two electrodes for external electrical connection separately provided from each other, contiguously provided at the one end of the first electrode strip positioned adjacent to the first short side and at the one end of the second electrode strip positioned adjacent to the second short side of the elongated substrate.

10. The light-emitting device according to claim 9:

wherein the light-emitting groups are electrically connected in series to the two electrodes for external electrical connection separately provided from each other, contiguously provided at the one end of the first electrode strip positioned adjacent to the first short side and at the one end of the second electrode strip positioned adjacent to the second short side of the elongated substrate.

11. The light-emitting device according to claim 9:

further comprising an elongated metal plate adhered to a lower surface of the elongated substrate;

the elongated substrate further including an elongated hole that penetrates the elongated substrate and extends along the long sides of the elongated substrate; and wherein the plurality of light-emitting diode elements of the light-emitting groups are directly disposed on the metal plate that is exposed within the elongated hole.

* * * * *